Nov. 3, 1964 R. GERR 3,155,916
BROAD-BAND DISTRIBUTED AMPLIFIER
Filed July 27, 1961
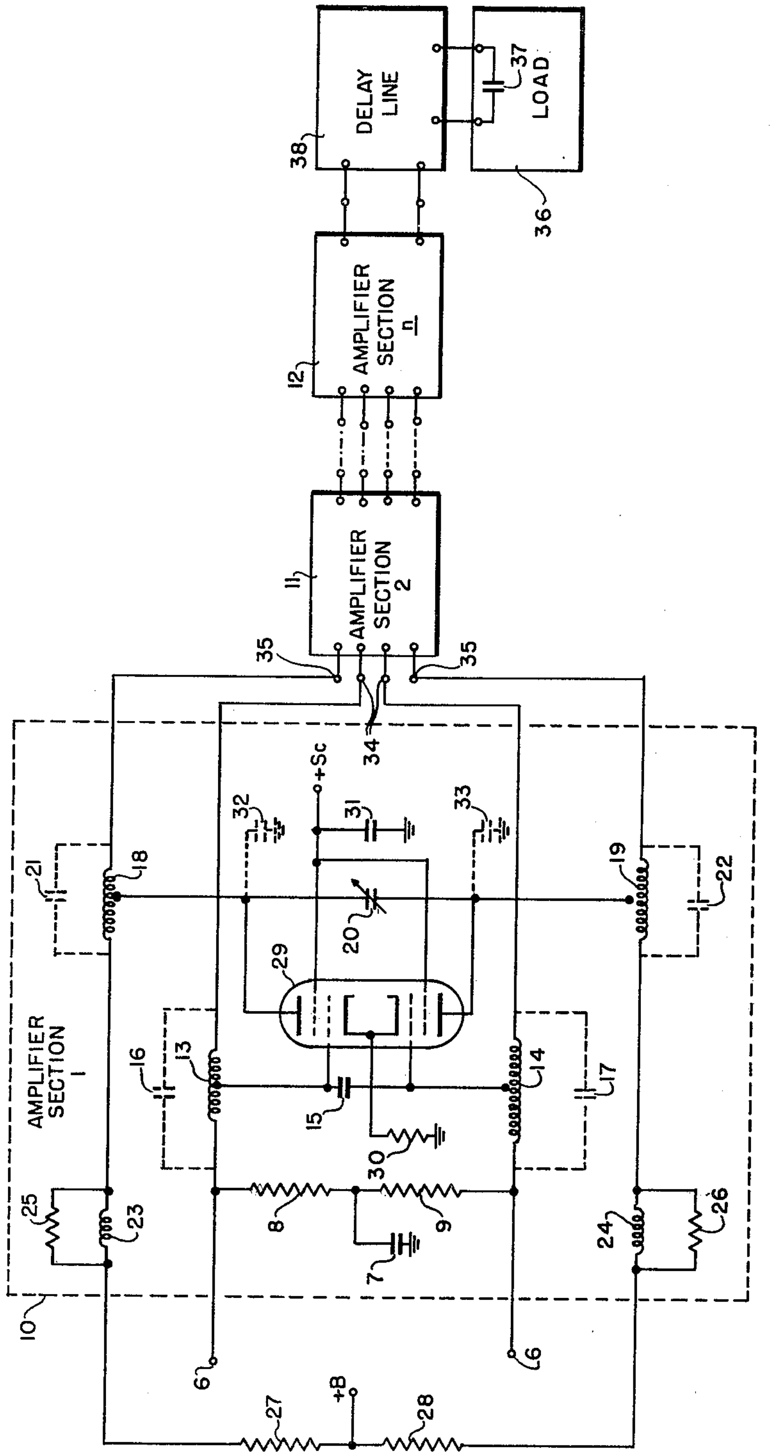

3,155,916
Patented Nov. 3, 1964

3,155,916

BROAD-BAND DISTRIBUTED AMPLIFIER

Raymond Gerr, New York, N.Y., assignor to Fairchild Camera and Instrument Corporation, a corporation of Delaware Filed July 27, 1961, Ser. No. 127,375
3 Claims. (Cl. 330—54)

This invention relates to broad-band distributed amplifiers and, while it is of general application, it is particularly suitable for use in a power amplifier driving the deflection plates of a cathode-ray oscilloscope and will be specifically described in such an embodiment.

In the electronics field, there is a well-known need for high-fidelity, broad-band, power amplifiers. Because of the fact that vacuum tubes, transistors, and other repeaters ordinarily employed in such amplifiers have undesired reactive and resistive impedances, it has become common practice to so associate such repeaters with a broad-band transmission line or filter designed to utilize such impedances as elements of the filter. This type of amplifier has come to be known as a "distributed amplifier" in that the undesired impedances of the repeaters are distributed over the electrical length of the line or filter.

It has been customary to employ pentode vacuum tubes in such distributed amplifiers because of their extremely high dynamic anode-cathode resistance and their low anode-cathode and anode-grid capacitances, such impedances usually appearing as shunt impedance elements in the associated filter section. For economic reasons, however, the use of pentode vacuum tubes in such an amplifier, particularly an amplifier including a large number of stages in order to obtain a high gain, becomes unattractive, particularly in the case of balanced or push-pull amplifiers. One disadvantage of the use of pentodes in such a balanced amplifier is that the tube characteristics must be accurately matched, usually involving tube selection, which substantially increases the cost. Moreover, in distributed amplifiers designed for modular or unit construction, the bulk of the large number of pentodes required undesirably increases the bulk and cost of the unit as a whole. On the other hand, if conventional triodes or tetrodes are used as repeaters in such an amplifier, it becomes difficult, if not impossible, to match the impedances of the several sections of the line to each other and to the terminations. In the absence of such impedance matching, reflections occur at the several junctions, thus substantially reducing the over-all gain of the amplifier.

Therefore, it would be desirable to provide a broad-band distributed amplifier of such a design that the characteristics of the repeaters are relatively uncritical, permitting the use, without selection, of relatively small and inexpensive repeaters such as the miniature dual triodes and dual tetrodes commercially available.

It is an object of the invention, therefore, to provide a new and improved broad-band distributed amplifier which obviates one or more of the above-mentioned limitations of prior distributed amplifiers.

It is another object of the invention to provide a new and improved broad-band distributed amplifier capable of tolerating repeater devices having relatively large undesired static and dynamic impedances without substantially impairing the over-all gain of the amplifier.

In accordance with the invention, a broad-band distributed amplifier comprises an $n$-section first broad-band filter, where $n$ is any desired integer, each section including a shunt impedance arm, an $n$-section second broad-band filter, each section including a shunt impedance arm, and at least $n$ signal repeaters, each having input electrodes included in the shunt impedance arm of a section of the first filter and output electrodes included in the shunt impedance arm of a corresponding section of the second filter. A terminating impedance is connected to one end of the second filter having a value $Z_0$ approximately equal to the characteristic impedance of the adjacent section and a termination is coupled to the other end of the second filter having an impedance of a value less than $Z_0$, the sections of the second filter having parameters so proportioned that the coefficients of reflection at the successive junctions, including the termination junctions, are proportional to the coefficients of a binomial expansion of the order $n$.

For a better understanding of the present invention, together with other and further objects thereof, reference is had to the following description, taken in connection with the accompanying drawing, and its scope will be pointed out in the appended claims.

Referring now to the drawing:

The single figure is a schematic representation of a balanced broad-band distributed amplifier embodying the invention.

Before describing specifically the broad-band amplifier embodying the present invention, it may be helpful to set forth certain fundamental principles on which the invention is based. It is well known that, in the propagation of a wave signal along a transmission line or multi-section filter, it is important that the characteristic impedances of all sections of the filter and the terminating impedances at either end of the filter be equal, in which case the signal is translated with minimum attenuation, in the case of a passive filter, or maximum gain, in the case of an active filter such as a distributed amplifier. If, however, there is a mismatch in the characteristic impedances at any junction, including the terminal junctions, a certain portion of the signal is reflected at such junction and, if there is more than one mismatch in the line or filter, multiple reflections occur, resulting in the development of standing waves in the line and a consequent loss of the useful signal propagated along the line.

It has been determined that if the several filter sections are designed so that the phases and amplitudes of the reflections at the successive junctions substantially mutually cancel, that is, if the summation of all the reflections as viewed at the input is substantially zero, the most effective signal-transfer ratio is attained, that is, there is a minimum attenuation in the case of a passive filter and a maximum gain in the case of an active filter. It can be shown mathematically that, in the case of an $n$-section filter, this relationship is realized if the coefficients of reflection at the successive junctions, including the terminal junctions, are proportional to the coefficients of the successive terms of the binomial expansion. It is well known that the $k$th term of such a binomial expansion of the order $n$ is $$\frac{n(n-1)\ \ldots\ (n-k+2)}{(k-1)!}$$

Referring now to the single figure of the drawing, there is represented schematically an $n$-section broad-band distributed amplifier, $n$ being any desired integer. Since the several sections are identical, except for the values of the circuit constants, only the first section is shown in detail. It is understood that the filters may be either balanced or unbalanced although the former type is shown by way of illustration. There is shown in the drawing, a broad-band distributed amplifier comprising a plurality of $n$-sections, only the amplifier sections 10, 11, and 12 being shown for clarity of drawing, the series of sections between the sections 11 and 12 being omitted, as indicated by the dotted line channels interconnecting these sections. Only the amplifier section 10 will be described in detail, it being understood that the remaining sections include the same circuit configuration.

The section 10 includes a first broad-band, substantially lossless balanced filter including series inductance arms 13 and 14 and a shunt impedance arm comprising the capacitor 15 interconnecting the mid-points of the inductors 13 and 14, the capacitor 15 being made up, in whole or in part, by the interelectrode capacitances of the repeaters described hereinafter. Shown in parallel with the inductors 13 and 14 are capacitances 16 and 17, respectively, shown in dotted lines to indicate that they are generally comprised of the inherent capacitances of their respective inductors. This filter section is of the well-known bridged-T configuration. The filter section comprising elements 13–17, inclusive, is provided with a terminating impedance comprising resistors 8 and 9 connected in series, the junction of which is grounded through a bypass capacitor 7. The input signal to amplifier section 10 is applied to the outer terminals of the resistors 8 and 9 through input terminals 6, 6.

Amplifier section 10 also includes a second balanced broad-band filter section, the filters of the several amplifier sections being connected in cascade to form a tapered filter. This second filter section includes series inductors 18 and 19 and a shunt impedance arm comprising an adjustable capacitor 20 connected between the mid-points of the inductors 18 and 19. Across the inductors 18 and 19 are shunt capacitances 21 and 22, respectively, shown in dotted line to indicate that they generally comprise the inherent capacitances of their respective inductors. It will be noted that this second broad-band filter is also of the bridged-T configuration. The filter section comprising the elements 18–22, inclusive, is provided with a terminating impedance connected to its lefthand terminals and comprising series inductors 23 and 24 shunted by resistors 25 and 26, respectively, in series with resistors 27 and 28, the junction of which is connected to a suitable source +B. The circuit constants of the terminating impedance comprising the elements 23–28, inclusive, are proportioned so that it has a value $Z_0$ approximately equal to the characteristic impedance of the filter section to which it is connected. As stated above, the load 36 constituting the termination for the other end of the broad-band filter including the line section 18–22, inclusive, has a value less than $Z_0$.

The amplifier including sections 10, 11, 12, etc., also comprises at least $n$ signal repeaters and, in the case of a balanced amplifier section as illustrated, $2n$ signal repeaters, the repeaters of the several sections being arranged in pairs connected in push-pull. Specifically, the repeaters of the amplifier section 10 comprises a dual tetrode 29 having its anodes connected to opposite terminals of the capacitor 20 and its control electrodes connected to opposite terminals of the capacitor 15. The common cathode of the tube 29 is connected to ground through a stabilizing reistor 30. The screen grids of the dual tetrode 29 are connected to a suitable positive bias source $+S_c$, preferably a regulated power supply, and are bypassed to ground through a bypass capacitor 31. The anodes of the dual tetrode 29 have inherent capacitance to ground, as represented by the dotted line capacitors 32 and 33.

The righthand terminals of the filter comprising elements 13–17, inclusive, are connected to output terminals 34, 34 of the amplifier section 10 while the output terminals of the filter comprising the elements 18–22, inclusive, are connected to output terminals 35, 35 of the amplifier section. The terminals 34, 34 and 35, 35 are connected to input terminals of the succeeding amplifier section 11, the terminals 35, 35 constituting the junction between adjacent sections of the broad-band filter. Similarly, the other sections of the amplifier are connected in cascade, ending up with the amplifier section 12 which is the $n$th section of the amplifier. The amplifier section 12 is connected to a load 36 indicated schematically as comprising the deflection plates 37 of a cathode-ray oscilloscope through a delay line 38, which may be of any well-known construction.

It is believed that the operation of each individual amplifier section, such as the section 10, will be apparent from the foregoing description since the section is itself conventional except for the use of the dual tetrode 29 which has a relatively low dynamic resistance shunted across the shunt arms of the filter section comprising elements 18–22, inclusive. In addition, the anode-cathode capacitances of the two sections of the tube 29, represented by the elements 32, 33, are substantially higher than those of a pentode customarily used in such an amplifier section. Input signals applied to the terminals 6, 6 are translated by the input filter section comprising elements 13–17, inclusive, amplified in the dual tetrode 29, and translated through the filter section comprising elements 18–22, inclusive. The impedance elements 23–28, inclusive, which terminate this filter section at its lefthand terminals with a value $Z_0$, substantially equal to that of the characteristic impedance of the filter section, is generally termed a reverse termination since it is connected to a point of the $n$-section filter in a direction opposite to that to which the useful signal is propagated. The input signal translated through the filter 13–17, inclusive, is applied via the terminals 34, 34 to the corresponding input filter section of the amplifier section 11, while the amplified output signal is applied by way of the filter 18–22, inclusive, and via the terminals 35, 35 to the corresponding section of the succeeding amplifier section 11. In a similar manner, the signal is translated by the various sections of the amplifier, connected in cascade, and by way of the delay line 38 to the load 36.

As stated above, it generally is not possible to design all of the output filter sections with the same characteristic impedance $Z_0$, due to the relatively low dynamic impedance of the dual tetrodes effectively in shunt with the shunt arms of the filter sections. As a result, there would be a considerable mismatch of impedance at each junction between adjacent amplifier sections. However, it has been discovered that if the several filter sections are designed with such characteristic impedances that the coefficients of reflection of the signal propagated along the amplifier at the several successive junctions, including the terminal junctions, are made proportional to the coefficients of the terms of a binomial expansion of the order $n$, where $n$ is the number of amplifier sections, the multiple reflections from the several junctions are of such phases and amplitudes that they substantially cancel, viewed either from the input or output end of the output circuit filter. It is well known that the coefficient of reflection between two adjacent filter sections numbered 1 and 2 in the direction of signal propagation may be calculated by the formula:

$$\gamma=\frac{Z_2-Z_1}{Z_2+Z_1}$$

where $Z_1$ and $Z_2$ are the characteristic impedance of the sections 1 and 2, respectively.

On the other hand, the dynamic impedances of the control electrode circuits of the tetrode repeaters are extremely high so that the input filter sections, such as the section comprising elements 13–17, inclusive, may be considered a substantially lossless filter section and all of the filter sections can be designed to have the same characteristic impedance which is equal to the terminating impedances at either end of the line.

While the broad-band distributed amplifier of the invention is adapted for embodiment in apparatus having a wide range of characteristic impedances and frequency pass bands, one broad-band distributed amplifier giving satisfactory operation comprised seven stages, each utilizing a type 6939 dual tetrode, and had a pass band of 0–70 mc., the coefficients of reflection at the junctions of the filter sections being proportional to the coefficients of the terms of a binomial expansion of the seventh order, namely 1, 7, 21, 35, 35, 21, 7, 1.

While there has been described what is, at present, considered to be the preferred embodiment of the invention, it will be obvious to those skilled in the art that various changes and modifications may be made therein without departing from the invention, and it is, therefore, aimed in the appended claims to cover all such changes and modifications as fall within the true spirit and scope of the invention.

What is claimed is:

1. A broad-band distributed amplifier comprising: an *n*-section first broad-band filter, where *n* is any desired integer, each section including a shunt impedance arm; an *n*-section second broad-band filter, each section including a shunt impedance arm; at least *n* signal repeaters, each having input electrodes included in the shunt impedance arm of a section of said first filter and output electrodes included in the shunt impedance arm of a corresponding section of said second filter; a terminating impedance connected to one end of said second filter and having a value $Z_0$ approximately equal to the characteristic impedance of the adjacent section thereof; and a termination coupled to the other end of said second filter having an impedance of a value less than $Z_0$, said sections of said second filter having parameters so proportioned that the coefficients of reflection at the successive junctions between adjacent sections thereof, including the termination junctions, are proportional to the coefficients of a binomial expansion of the order *n*.

2. A broad-band distributed amplifier comprising: an *n*-section untapered substantially lossless first broad-band filter, where *n* is any desired integer, each section including a shunt impedance arm; an *n*-section tapered second broad-band filter, each section including a shunt impedance arm; at least *n* signal repeaters, each having input electrodes included in the shunt impedance arm of a section of said first filter and output electrodes included in the shunt impedance arm of a corresponding section of said second filter, said output electrodes having a substantial dynamic conductance; a terminating impedance connected to one end of said second filter and having a value $Z_0$ approximately equal to the characteristic impedance of the adjacent section thereof; and a termination coupled to the other end of said second filter having an impedance of a value less than $Z_0$, said sections of said second filter having parameters so proportioned that the coefficients of reflection at the succesive junctions between adjacent sections thereof, including the termination junctions, are proportional to the coefficients of a binomial expansion of the order *n*.

3. A broad-band distributed amplifier comprising: an *n*-section balanced first broad-band filter, where *n* is any desired integer, each section including a shunt impedance arm; an *n*-section balanced second broad-band filter, each section including a shunt impedance arm; 2*n* signal repeaters arranged in pairs connected push-pull, each pair having input electrodes included in the shunt impedance arm of a section of said first filter and output electrodes included in the shunt impedance arm of a corresponding section of said second filter; a terminating impedance connected to one end of said second filter and having a value $Z_0$ approximately equal to the characteristic impedance of the adjacent section thereof; and a termination coupled to the other end of said second filter having an impedance of a value less than $Z_0$, said sections of said second filter having parameters so proportioned that the coefficients of reflection at the successive junctions between adjacent sections thereof, including the termination junctions, are proportional to the coefficients of a binomial expansion of the order *n*.

References Cited in the file of this patent

UNITED STATES PATENTS 2,930,986 Kobbe et al. ------------ Mar. 29, 1960

OTHER REFERENCES

Southworth, G. C.: Principles and Applications of Waveguide Transmission, 1950, D. Van Nostrand Co., Inc., N.Y., pages 262–273.